(12) United States Patent
Uchiyama

(10) Patent No.: US 6,265,770 B1
(45) Date of Patent: Jul. 24, 2001

(54) MOUNTING STRUCTURE OF SEMICONDUCTOR CHIP, LIQUID CRYSTAL DEVICE, AND ELECTRONIC EQUIPMENT

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/275,372

(22) Filed: Mar. 24, 1999

(30) Foreign Application Priority Data

Mar. 24, 1998 (JP) .................................................. 10-076334
Oct. 8, 1998 (JP) .................................................. 10-287099

(51) Int. Cl.⁷ .................................................. H01L 23/04
(52) U.S. Cl. .......................... 257/698; 257/783; 257/778; 257/787
(58) Field of Search .................................. 257/698, 692, 257/780, 781, 778, 786, 783, 787

(56) References Cited

U.S. PATENT DOCUMENTS

| | | | |
|---|---|---|---|
| 5,592,025 | * | 1/1997 | Clark et al. . |
| 5,612,576 | * | 3/1997 | Wilson et al. . |
| 5,726,489 | * | 3/1998 | Matsuda et al. . |
| 5,736,789 | * | 4/1998 | Moscicki . |
| 5,834,835 | * | 11/1998 | Mackawa . |
| 6,016,013 | * | 1/2000 | Baba . |
| 6,057,597 | * | 5/2000 | Farnworth et al. . |
| 6,064,114 | * | 5/2000 | Higgins et al. . |

FOREIGN PATENT DOCUMENTS

| | | | |
|---|---|---|---|
| 55-11361 | * | 1/1980 | (JP) . |
| 63-50049 | * | 3/1988 | (JP) . |
| 63-64330 | * | 3/1988 | (JP) . |
| 63-208261 | * | 8/1988 | (JP) . |
| 1-147836 | * | 6/1989 | (JP) . |
| 2-177553 | * | 7/1990 | (JP) . |

* cited by examiner

Primary Examiner—Sheila V. Clark
(74) Attorney, Agent, or Firm—Harness, Dickey & Pierce, P.L.C.

(57) ABSTRACT

A mounting structure of a semiconductor chip including a semiconductor chip 6 with a plurality of bumps 16, and a circuit substrate 3 with a plurality of output wires 11 and input terminals 12. In the press-bonding process, ACF 4 is used to join the semiconductor chip 6 and the circuit substrate 3 together so as to allow electrical conduction between the bumps 16 and the land parts of, for example, the output wires 11. A plurality of transfixion holes 10 are formed so as to be spread out in an area of the circuit board 3 surrounded by the land parts of the wires 11 and the terminals 12, and the excess ACF 4, present during the press-bonding, is allowed to escape through the transfixion holes 10, thereby preventing generation of a large internal stress in the ACF 4. This allows the IC 6 to be joined more reliably.

24 Claims, 8 Drawing Sheets

Fig. 9 *Prior Art*
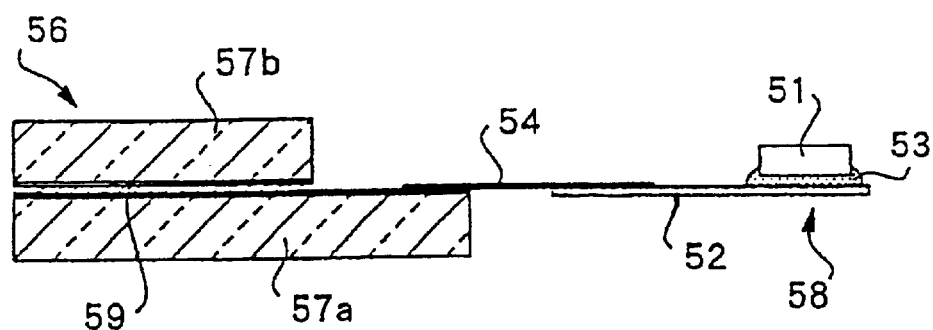
Fig. 10 *Prior Art*
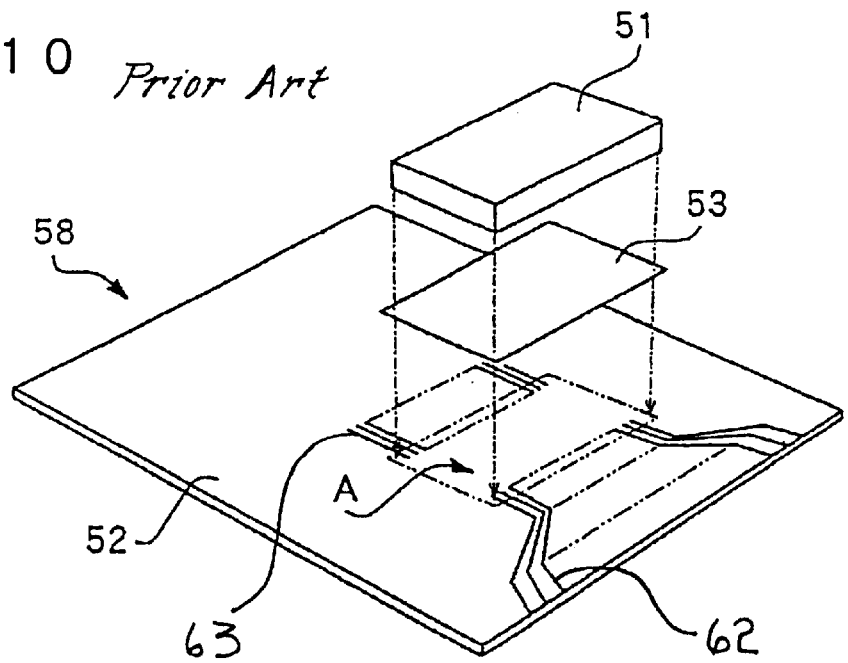

MOUNTING STRUCTURE OF SEMICONDUCTOR CHIP, LIQUID CRYSTAL DEVICE, AND ELECTRONIC EQUIPMENT

INDUSTRIAL FIELD OF THE INVENTION

The present invention relates to a mounting structure of a semiconductor chip, wherein a semiconductor chip is mounted onto a substrate using an adhesive material such as an anisotropic conductive film (ACF), and, more particularly, to a mounting structure of a semiconductor chip, wherein a plurality of bumps of a semiconductor chip and a plurality of lands on a substrate are joined together in such a manner as to allow electrical conduction therebetween. The present invention also relates to a liquid crystal device employing the mounting structure of a semiconductor chip and electronic equipment using the liquid crystal device.

DESCRIPTION OF THE RELATED ART

Currently, liquid crystal devices are widely used in electronic equipment, such as portable telephones or portable information terminals. In order to display visible information consisting of, for example, characters, numerals, or patterns, liquid crystal devices are frequently used in electronic equipment.

In general, such a liquid crystal device comprises liquid crystal filled between a pair of light-transmissive substrates, and the orientation of the liquid crystal is controlled as a result of controlling the voltage applied to the liquid crystal, in order to modulate the light incident upon the liquid crystal. In order to control the voltage applied to the liquid crystal, the liquid crystal device requires an integrated circuit (IC) for driving the liquid crystal, that is a semiconductor chip, with the IC being connected to the aforementioned light-transmissive substrates either directly or indirectly through a substrate.

The connecting of the liquid crystal driving IC to the light-transmissive substrates of the liquid crystal device through a substrate is considered, for example, in the following way, as illustrated in FIG. 9. A mounting structure 58 is formed by connecting the liquid crystal driving IC 51 on the substrate 52 using the ACF 53, and the substrate 52 in the mounting structure 58 is connected to the light-transmissive substrate 57a of the liquid crystal device 56 using connecting members such as FPC (Flexible Printed Circuit) 54. The liquid crystal device 56 comprises the light-transmissive substrate 57a and a light-transmissive substrate 57b with liquid crystal 59 filled therebetween.

However, in general, as shown in FIG. 10, in the conventional mounting structure 58 of a semiconductor chip, area A for mounting thereon the liquid crystal driving IC 51 of the substrate 52 is formed on the same flat surface as the other areas of the substrate 52. Therefore, when there is too much ACF 53, a large residual stress is produced in the ACF 53 during press-bonding, resulting in the problem that joining failure occurs with the passage of time.

In FIG. 10, reference numeral 62 denotes an input wiring with respect to the IC 51, and reference numeral 63 denotes an output wiring from the IC 51. Although many wires are actually formed, only some of the wires are shown in full in FIG. 10, while the rest, which are not shown in full, are shown by chain lines.

Japanese Unexamined Utility Model Publication No. 3-39876 discloses a technique of forming transfixion holes in an area to which chip parts, which are different from the semiconductor chip, are mounted. However, the transfixion holes discussed in this document are formed for the purpose of making it easier to allow the chip mounting portion to be depressed, and not for the purpose of preventing generation of residual stress in the adhesive. Therefore, according to the conventional document, the following technical requirements are not satisfied: the formation of transfixion holes in an area surrounded by a plurality of lands disposed on the substrate side in correspondence with the bumps of the semiconductor chip, and the formation of transfixion holes in such a manner that they are spread out over the area.

In view of the above-described problem, it is an object of the present invention to make it possible to achieve more reliable connection between electrode terminals, in a mounting structure which mounts a semiconductor chip such as a liquid crystal driving IC onto a substrate using an adhesive such as ACF.

SUMMARY OF THE INVENTION (1) To this end, according to the present invention, there is provided a mounting structure of a semiconductor chip comprising a semiconductor chip with a plurality of bumps, and a substrate with a plurality of lands; wherein the semiconductor chip and the substrate are connected together with an adhesive so as to allow electrical conduction between the bumps and the lands. In the mounting structure of a semiconductor chip, a plurality of transfixion holes are formed in an area of the substrate surrounded by the plurality of lands such that the transfixion holes are spread out over the area.

According to the mounting structure of a semiconductor chip, pressing the semiconductor chip against the substrate with an adhesive therebetween, causes the semiconductor chip to be affixed to the substrate. In this case, when there is too much adhesive between the semiconductor chip and the substrate, the excess adhesive enters the transfixion holes, so that residual stress is not produced in the adhesive. As a result, it is possible to eliminate the problem that joining failure at the joint portion occurs with the passage of time.

The mounting structure of a semiconductor chip of the present invention can be formed by, for example, the COB (chip on board) method or the COF (chip on FPC) method. A mounting structure formed by the COB method comprises a semiconductor chip mounted onto a relatively hard and thick substrate, such as an epoxy substrate. A mounting structure formed by the COF method comprises a semiconductor chip mounted onto a flexible and relatively thin board, such as a flexible printed circuit (FPC) substrate.

(2) It is desirable that the ratio R, in percent, of the area of the transfixion holes to the area of the liquid crystal driving IC (that is, the semiconductor chip) be $$0\% < R \leq 18\%$$

By setting R within this range, the excess adhesive can reliably escape to the transfixion holes during press-bonding.

(3) It is more desirable that the ratio R, in percent, of the area of the transfixion holes 9 to the area of the semiconductor chip be $$2\% < R \leq 10\%$$

By setting R within this range, the excess adhesive can reliably escape to the transfixion holes during press-bonding, so that the substrate can provide a larger area for forming wiring patterns thereon.

(4) Regarding the above-described mounting structure of a semiconductor chip, it is desirable to form the through holes, to be formed in the substrate, within an area surrounded by the lands such that they are provided closer to the lands than to the center portion of the area. This allows all of the excess adhesive, removed by the bumps and the lands, to reliably escape to the transfixion holes.

(5) The substrate used in the present invention may be formed with one with a single wiring layer or one with a plurality of wiring layers that are electrically connected to each other through a plurality of electrically conductive through holes. When a substrate with a plurality of electrically conductive through holes is used, these electrically conductive through holes can be used as transfixion holes for allowing escape of excess adhesive.

At present, the electrically conductive through holes to be formed in the substrate are often formed outwardly of the IC chip mounting area. When the wiring patterns are to be formed close together within a small area of the substrate, it is very effective to dispose the electrically conductive through holes within the IC chip mounting area. In this case, it is very effective to use the electrically conductive through holes as transfixion holes for allowing escape of excess adhesive.

(6) The liquid crystal device of the present invention comprises liquid crystal sandwiched between a pair of light-transmissive substrates, wherein the orientation of the liquid crystal is controlled by controlling the voltage applied to the liquid crystal, in order to modulate the light incident upon the liquid crystal. The liquid crystal device includes a mounting structure of a semiconductor chip, the mounting structure being adhered to at least one of the light-transmissive substrates, the mounting structure including a liquid crystal driving IC with a plurality of bumps, and a substrate with a plurality of lands. The liquid crystal driving IC and the substrate are joined together with an adhesive so as to allow electrical conduction between the bumps and the lands. A plurality of transfixion holes are formed in an area of the substrate surrounded by the lands such that they are spread out over the area.

When the liquid crystal device is being produced, with an adhesive placed between the liquid crystal driving IC (that is, the semiconductor chip) and the substrate, the liquid crystal driving IC is pressed against and affixed to the substrate. In this case, when the liquid crystal driving IC is press-bonded to the board with too much adhesive, the excess adhesive enters the transfixion holes, so that residual stress is not generated in the adhesive.

(7) In the liquid crystal device of section (6), it is desirable that the ratio R, in percent, of the total area of the transfixion holes to the area of the liquid crystal driving IC be $$0\% < R \leq 18\%$$

By setting R within this range, the excess adhesive, during press-bonding, can reliably escape to the transfixion holes.

(8) In the liquid crystal device of section (6), it is more desirable that the ratio R, in percent, of the total area of the transfixion holes to the area of the liquid crystal driving IC be $$2\% \leq R \leq 10\%$$

By setting R within this range, the excess adhesive, during press-bonding, can reliably escape to the transfixion holes, so the board can provide a larger area for forming wiring patterns thereon.

(9) In the liquid crystal devices of sections (6) to (8), it is desirable that the transfixion holes, for allowing the excess adhesive to escape therethrough, be formed within an area surrounded by the plurality of lands such that they are disposed closer to the lands than to the center portion of the area. This allows the excess adhesive, removed by the bumps and the lands during press-bonding of the liquid crystal driving IC to the substrate, to reliably and unforcedly escape to the transfixion holes.

(10) In the liquid crystal devices of sections (6) to (9), the substrate may be formed with one having a plurality of wiring layers electrically connected with each other by a plurality of through holes. In this case, a plurality of transfixion holes can be formed by those through holes for allowing escape of excess adhesive. This makes it unnecessary to form transfixion holes specifically for the purpose of allowing escape of excess adhesive. As a result, the substrate, which can provide a larger area for, for example, mounting wires thereto, can be effectively used.

(11) The electronic equipment of the present invention includes any one of the liquid crystal devices of sections (6) to (10). The electronic equipment may be a portable telephone, a portable terminal, or the like.

BRIEF DESCRIPTION OF THE DRAWINGS

FIG. 9 is an illustration of a conventional liquid crystal device provided with a mounting structure of a semiconductor chip is mounted.

FIG. 10 is an exploded perspective view of the mounting structure of a semiconductor chip of FIG. 9.

DETAILED DESCRIPTION OF THE PREFERRED EMBODIMENTS (Embodiment of the Mounting Structure of a Semiconductor Chip)

Figure 1:
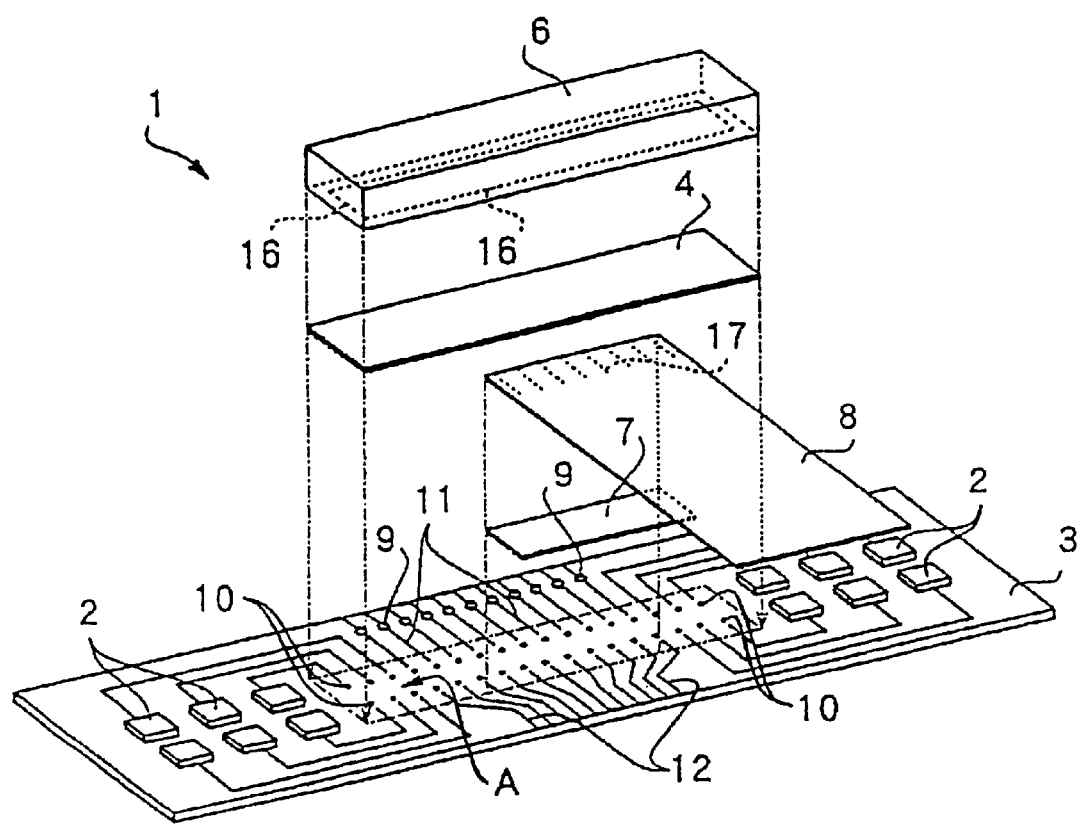
FIG. 1 is an exploded perspective view of an embodiment of the mounting structure of a semiconductor chip in accordance with the present invention.

FIG. 1 illustrates an embodiment of the mounting structure of a semiconductor chip in accordance with the present invention. The mounting structure 1 of a semiconductor chip includes a circuit substrate 3, onto which are mounted electronic chip parts 2 such as a chip capacitor or a chip resistor; a liquid crystal driving IC 6 for being joined to a surface of the circuit substrate 3 using ACF 4 as adhesive; and an input cable 8 for being joined to a surface of the circuit substrate 3 using the ACF 7.

The electronic chip parts 2 form the circuit for driving the liquid crystal device. These electronic chip parts 2 can be joined to the circuit substrate by soldering or the like. The joining may also be achieved using an electrically conductive adhesive, such as silver paste or ACF.

The circuit substrate 3 is formed, for example, by covering copper foil on the front and back sides of a glass epoxy base material; by forming a wiring pattern thereon by etching; and by allowing electrical conduction between the front and back sides via through holes 9. Problems such as migration can be satisfactorily prevented by applying a Ni—Au coating onto the surface of the wiring pattern.

Figure 2:
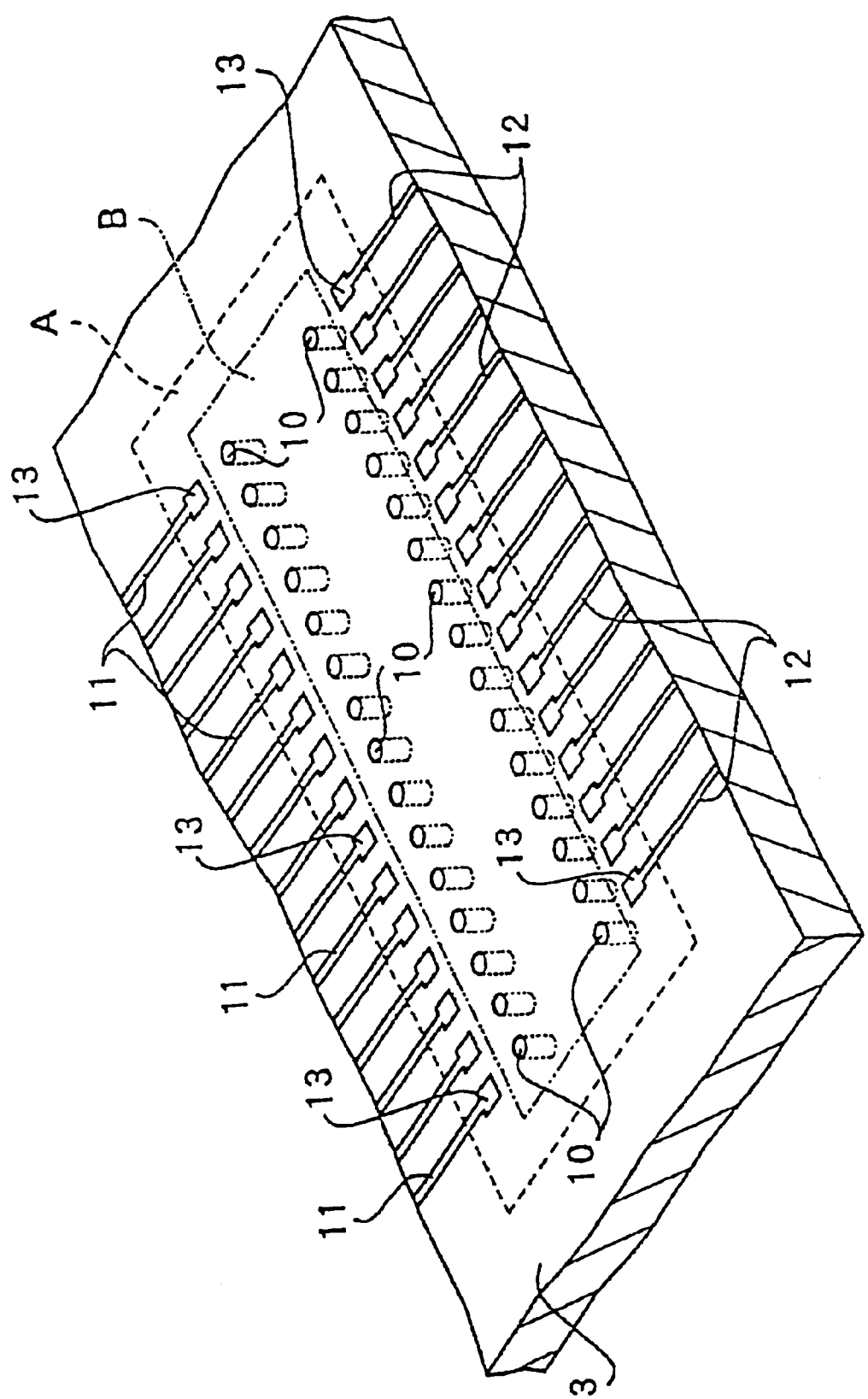
FIG. 2 is a perspective view of the main portion of the mounting structure of a semiconductor chip of FIG. 1.
Figure 4:
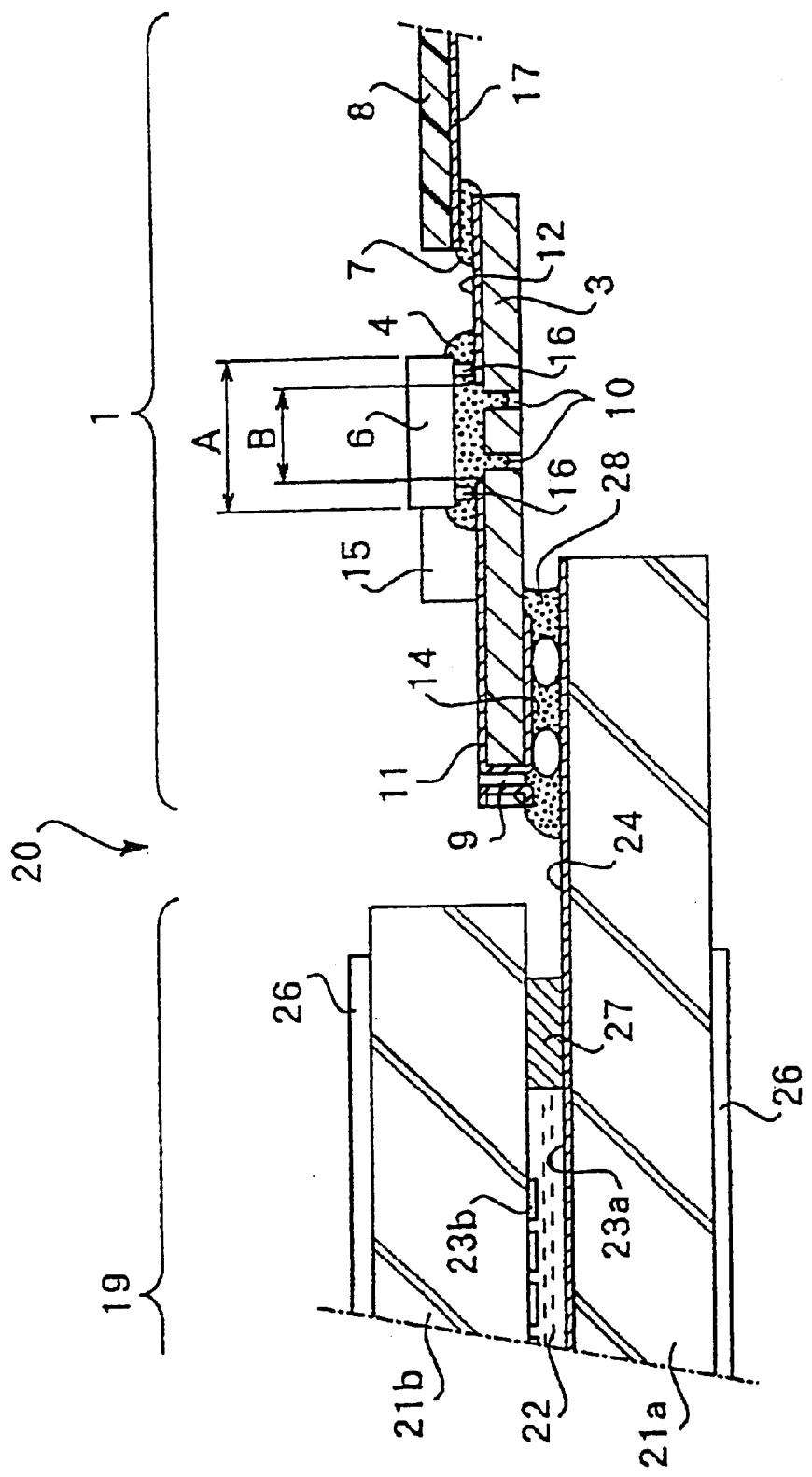
FIG. 4 is a sectional view of the cross-sectional structure of the main portion of the liquid crystal device of FIG. 3.

On a surface of the circuit substrate 3 is formed an IC mounting area A for mounting thereto the liquid crystal driving IC 6. A plurality of output wires 11 and input terminals 12 are provided for forming the wiring patterns, with one end of each of the output wires 11 and the input terminals 12 being formed into lands 13 in the IC mounting area A, as shown in FIG. 2. As shown in FIG. 4, at the back side of the output wires 11, that is at the surface opposite to the surface facing the liquid crystal driving IC 6, are formed output terminals 14 in correspondence with the respective output wires 11. The output terminals 14 and the respective output wires 11 are connected by the through holes 9 to allow electrical conduction therebetween.

In FIG. 1, a plurality of bumps 16 are formed at the bottom surface, that is, at the active surface, of the liquid crystal driving IC 6, with the bumps 16 being joined to their respective output wires 11 on the circuit substrate 3, using the ACF 4. The ACF 4 can be formed by dispersing electrically conductive particles in an adhesive which is an epoxy-based adhesive. The electrically conductive particles are formed by applying a Ni—Au coating on polystyrene particles with a particle diameter of 5 $\mu$m. When the ACF 4 is used, thermal press-bonding can be performed for 30 seconds, at a temperature of 180° C. and under a pressure of 10 gf/bump.

Wiring patterns 17 are formed at the bottom surface of one end of the input cable 8, and are joined to their corresponding input terminals 12 on the circuit substrate 3 using the ACF 7 in such a manner as to allow electrical conduction therebetween. The ACF 7 consists of electrically conductive particles and an adhesive, which is an epoxy-based adhesive, with the electrically conductive particles being nickel particles with a particle diameter of approximately 3 to 10 $\mu$m. The wiring patterns 17 are connected to the input terminals 12 by pressing for 20 seconds, at a temperature of 170° C. and under a pressure of 3 MPa.

The circuit substrate 3 and the input cable 8 can be joined together by soldering, either manually or mechanically, as has been conventionally the case. Furthermore, it is desirable to be preventive of moisture, dust, damage as a result of mechanical contact or the like by coating the joint of the circuit substrate 3 and the input cable 8 using a molding material such as silicone resin, acrylic resin, or urethane resin. Such molding materials may also be similarly coated onto, for example, the joint of the circuit substrate 3 and the liquid crystal panel described later, the joint of the liquid crystal driving IC 6 and the circuit substrate 3, or the joint of the electronic parts 2 and the circuit substrate 3.

As shown in FIG. 2, in the mounting structure 1 of a semiconductor chip of the present invention, the plurality of transfixion holes 10 are formed within the IC mounting area A, or, more specifically, within the area B surrounded by the lands 13 of the plurality of output wires 11 and the lands 13 of the plurality of input terminals 12.

When R represents the ratio, in percent, of the total area of the transfixion holes 10 to the area of the surface of the liquid crystal driving PC 6 to be mounted on the substrate 3, it is desirable that $$0\% < R \leq 18\%$$

based on the simulation results, the measurements of the extent to which the joining failure occurs with the passage of time, and the experiments carried out to determine the joining strength between the liquid crystal driving IC 6 and the circuit substrate 3. This means that when R is 0%, residual stress remains, joining failure occurs with the passage of time, whereas when R is more than 18%, a sufficient joining strength cannot be attained. It is more desirable that $$2\% \leq R \leq 10\%$$

In this case, the excess ACF 4 can escape through the transfixion holes 10 while the joining strength between the liquid crystal driving IC 6 and the circuit substrate 3 is ensured, so that the residual stress can be reduced. In addition, when the transfixion holes 10 are formed as close as possible to the bumps rather than towards the central portion of the area B that is surrounded by the lands, the excess ACF can escape quickly at the joint portion of the bumps and their corresponding lands.

In the mounting structure of a semiconductor chip of the present embodiment, the plurality of transfixion holes 10 are formed in a dispersion state within the IC mounting area A of the circuit substrate 3, or more specifically within the area B (see FIG. 2) surrounded by the lands, so that when the ACF 4 is pressed by a pressing head during pressing of the liquid crystal driving IC 6 against the circuit substrate 3, the excess ACF 4 enters the transfixion holes 10 and escapes from the liquid crystal driving IC 6. Therefore, a proper amount of ACF 4 is always present between the IC 6 and the circuit substrate 3, as a result of which a large residual stress is not produced in the ACF 4 that is being pressed for joining the IC 6 and the circuit board 3 together. Consequently, joining failure does not occur with the passage of time, so that the bumps 16 of the IC 6 and the lands of the circuit substrate 3 are more reliably joined together.
(Modifications)

Various modifications can be made of the above-described mounting structure of a semiconductor chip as follows. In the above-described embodiment, the transfixion holes 10, which are simple through holes, are formed in order to allow excess adhesive, such as excess ACF 4, to escape. However, when the circuit board 3, to which the liquid crystal driving IC 6 is mounted, is a two sided circuit substrate having wiring layers on both front and back sides thereof, and electrically conductive through holes for allowing electrical conduction between the wiring layers are provided within the IC mounting area A, the electrically conductive through holes may also be used as transfixion holes for allowing escape of excess adhesive.

As the base material of the circuit substrate 3, in place of a glass epoxy base material, being a composite material of glass fiber and epoxy resin, a composite material of a first and a second material nay also be used, wherein the first material may be aramid fiber or a composite material of, for example, glass fiber and aramid fiber, and the second material may be, for example, polyimide resin or BT (bismaleid triazine) resin.

The circuit substrate can be formed using substrate materials made of the epoxy resin, the polyimide resin, the BT resin, or the like or in chemical combination thereof of combination materials.

Although in the present embodiment wirings are formed on both surfaces of the circuit substrate 3, a wiring may be formed on only one of the surfaces of the circuit substrate 3. In addition, the circuit substrate 3 may be a multi-layered circuit substrate consisting of, for example, three or four layers. In a circuit substrate 3 with a wiring on only one of the surfaces thereof, output terminals are formed on the liquid crystal driving IC 6 mounting surface, so that the cost of the circuit substrate can be reduced. In a circuit substrate 3 with multiple layers, noise problems can relatively easily be solved by forming a ground layer or making the power supply wiring pattern thicker.
(Embodiment of the Liquid Crystal Device)

Figure 3:
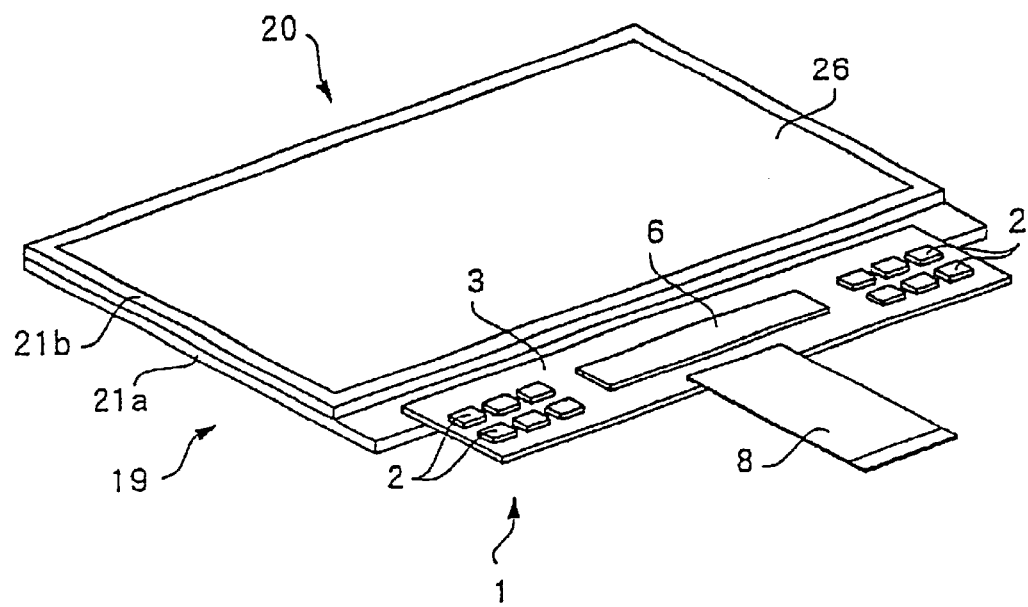
FIG. 3 is a perspective view of an embodiment of the liquid crystal device in accordance with the present invention.

FIG. 3 illustrates a liquid crystal device using the mounting structure 1 of a semiconductor chip of FIG. 1. The liquid crystal device 20 comprises the mounting structure 1 and a liquid crystal panel 19 joined thereto.

As shown in FIG. 4, the liquid crystal panel 19 is formed by affixing a pair of light-transmissive substrates 21a and 21b with a sealant 27, and by filling liquid crystal 22 between the substrates 21a and 21b. A light-transmissive electrode 23a is formed on the inside surface of the light-transmissive substrate 21a, while light-transmissive electrodes 23b are formed on the inside surface of the light-transmissive substrate 21b.

The light-transmissive substrate 21a extends beyond the opposing light-transmissive substrate 21b, with panel side terminals 24 being formed on the portion of the light-transmissive substrate 21a extending beyond the light-transmissive substrate 21b. There are two types of panel side terminals 24. They are those that extend directly from the light-transmissive electrode 23a, and those that are connected to the light-transmissive electrodes 23b through an electrically conductive member (not shown) between the both substrates 21a and 21b. Polarizers 26 are affixed to the outside surface of the light-transmissive substrates 21a and 21b.

With the output terminals 14, formed at the circuit substrate 3, being aligned with the panel side terminals 24, the mounting structure 1 of a semiconductor chip is joined to the light-transmissive substrate 21a so as to allow electrical conduction therebetween using the ACF 28 interposed between the output terminals 14 and the panel side terminals 24. In the present embodiment, the ACF 28 consists of electrically conductive particles, being 10-$\mu$m polystyrene particles coated with Ni—Au, and an epoxy-based adhesive. They are joined together by pressing for 20 seconds, at a temperature of 170° C. and under a pressure of 3 MPa.

Instead of being joined with the ACF 28, the output terminals 14 formed at the circuit substrate 3, and the panel side terminals 24 may be directly brought into contact using an adhesive not containing electrically conductive particles in order to allow electrical conduction therebetween. This joining method eliminates the possibility of a short circuit caused by the electrically conductive particles of the ACF, thereby allowing them to be joined together, with even finer pitches.

As shown in FIG. 4, in the liquid crystal device 20 having the above-described structure, the mounting structure 1 of a semiconductor chip has a plurality of transfixion holes 10 formed so as to be spread out within the IC mounting area A on the circuit substrate 3, more specifically within area B surrounded by the lands 13 of the output wires 11 and the input terminals 12, so that excess ACF 4 enters the transfixion holes 10 during press-bonding of the liquid crystal driving IC 6, making it possible to prevent a large residual stress from being generated in the ACF 4 during press-bonding.
(Embodiment of Electronic Device)

Figure 5:
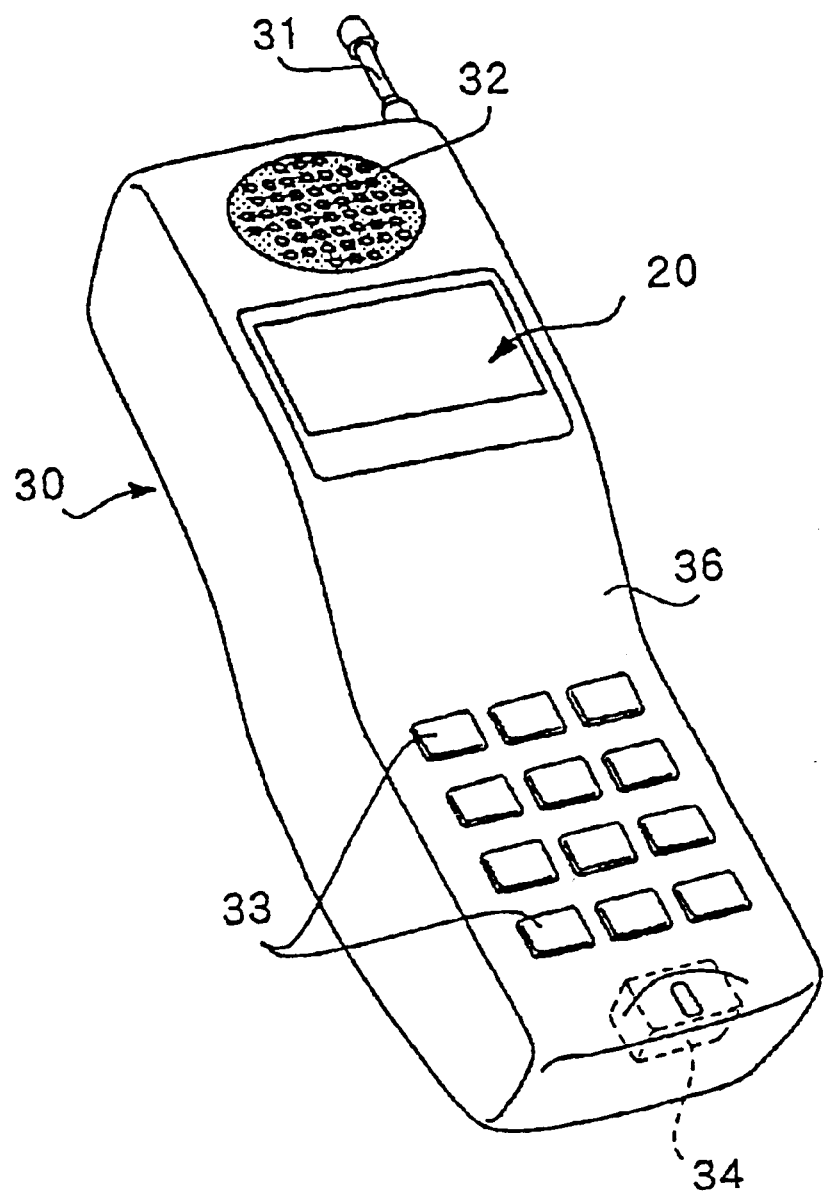
FIG. 5 is a perspective view of an embodiment of the electronic equipment in accordance with the present invention.

FIG. 5 illustrates; an embodiment of a portable telephone being an example of the electronic equipment in accordance with the present invention. The portable telephone 30, shown in FIG. 5, comprises an outer case 36 with various structural components formed thereat, such as an antenna 31, a speaker 32, a liquid crystal device 20, a key switch 33, a microphone 34 and the like. The liquid crystal device 20 has the structure shown in FIG. 3.

Figure 6:
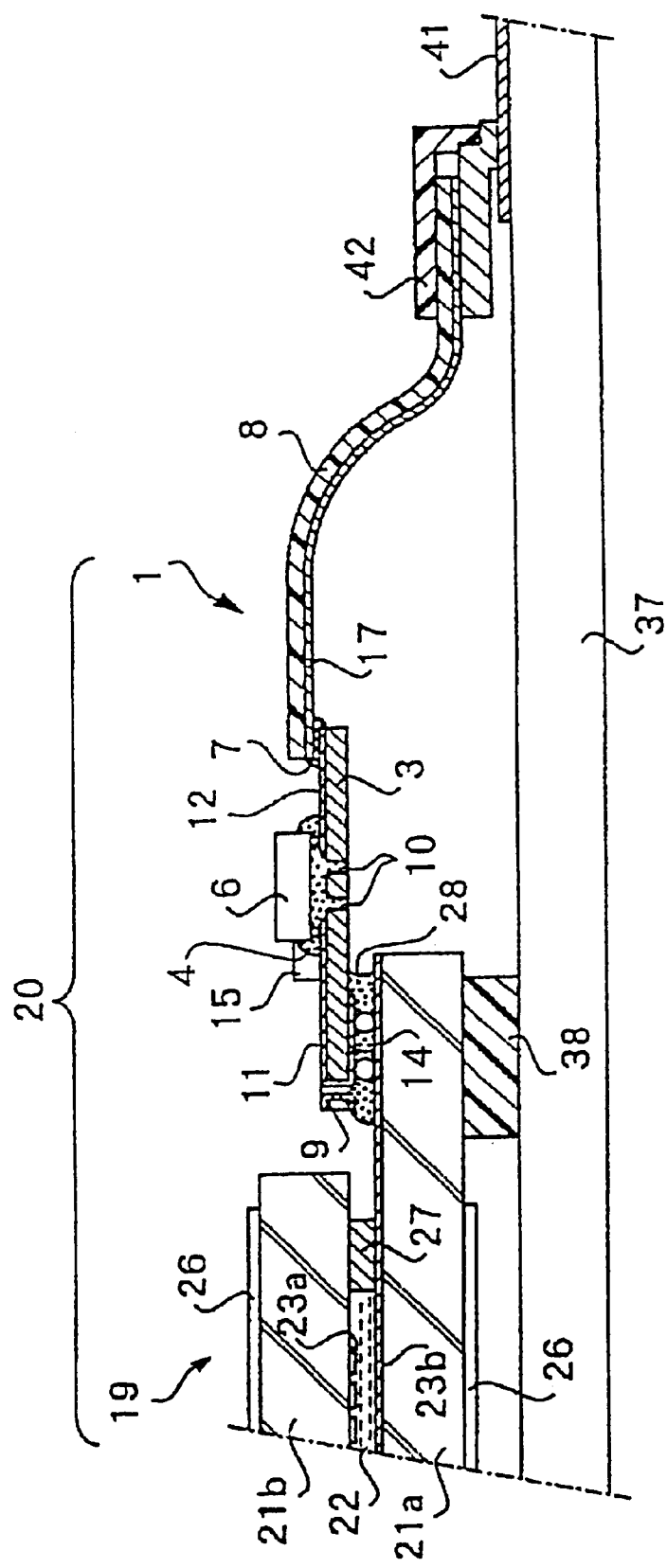
FIG. 6 is a sectional view of the main portion of the internal structure of the electronic equipment of FIG. 5.

FIG. 6 illustrates the main portion of the internal structure of the portable telephone of FIG. 5, in which the liquid crystal device 20, comprising the liquid crystal panel 19 and the mounting structure 1 of a semiconductor chip, is mounted to a body substrate 37 of the portable telephone 30. The liquid crystal panel 19 is affixed to a predetermined location of the body substrate 37 using either an adhesive for cushion affixing member 38, whose base material is silicone rubber or foaming urethane, or a double-sided tape, whose base material is nonwoven fabric.

A terminal 41 for supplying electrical power or for sending an input signal to the liquid crystal device 20 is formed on the body substrate 37, and a female connector 42 connected to the terminal is provided thereon. The liquid crystal device 20 is connected to the electrical power side of the body substrate 37 by removably inserting the input cable 8 to the connector 42.

By using the mounting structure 1 of FIG. 1 for the portable telephone described above, the excess ACF 4 is allowed to escape to the transfixion holes 10 during mounting of the liquid crystal driving IC 6 to the circuit substrate 3 using the ACF 4, so that more reliable joining of the IC 6 can be achieved.

Figure 7:
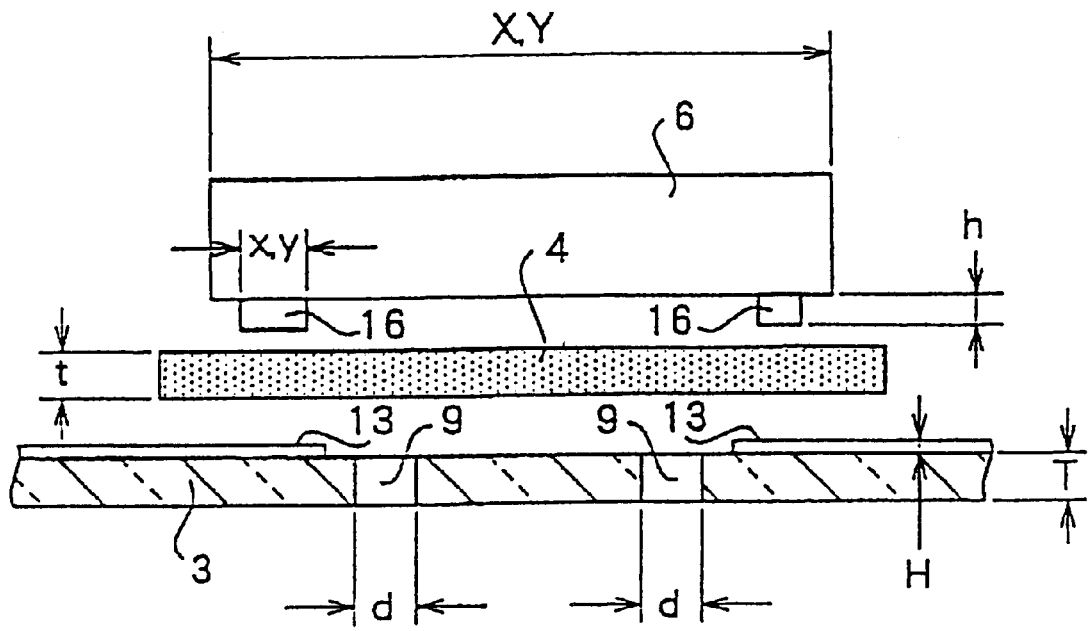
FIG. 7 is a schematic illustration of a state previous to the completion of the mounting of the semiconductor chip, in the mounting structure of a semiconductor chip in accordance with the present invention.
Figure 8:
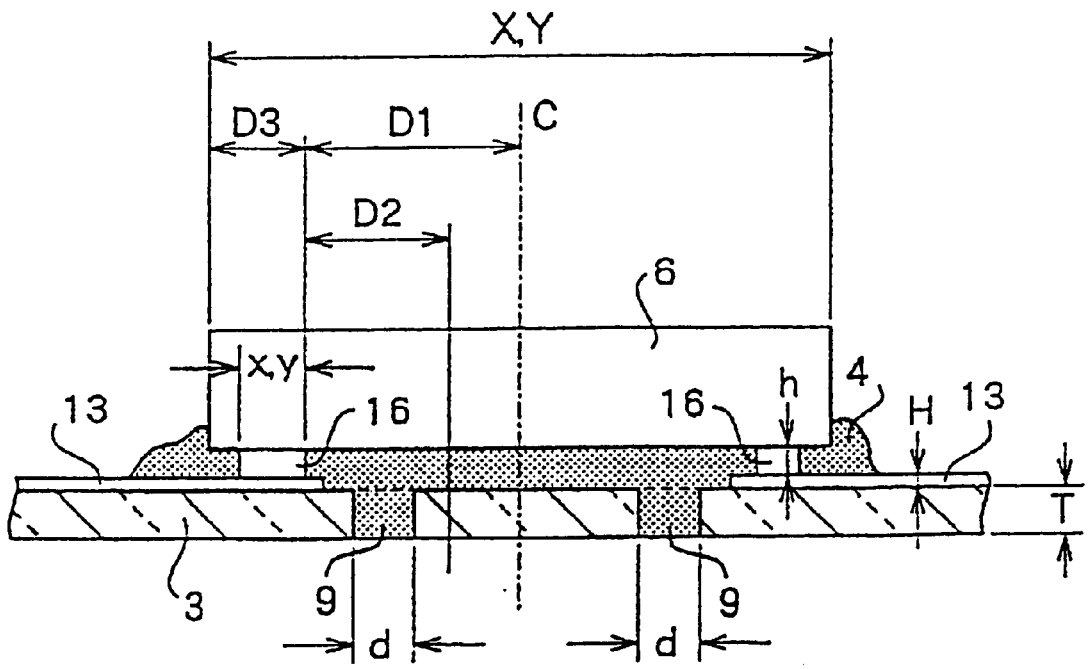
FIG. 8 is a schematic illustration of a state after the completion of the mounting of the semiconductor chip, in the mounting structure of a semiconductor chip shown in FIG. 7.

The present inventor simulated the arrangement of the plurality of transfixion holes formed in the substrate in the present invention, and obtained the following results. Here, the state shown in FIG. 7 is used as a model of the state prior to press-bonding, and the state shown in FIG. 8 is used as a model of the state after press-bonding. The meaning of the respective reference numerals in the figures are as follows:

X, Y: Outside dimension of the liquid crystal driving IC 6 (that is, the semiconductor chip)
x, y: Outside dimension of the bumps 16
h: Height of the bumps 16
n: Number of bumps 16
t: Thickness of GUCF (that is, adhesive ) 4
T: Thickness of the substrate 3
H: Thickness of the lands 13
d: Diameter of through holes(that is, transfixion holes) 9
N: Number of through holes 9

(A) When the liquid crystal driving IC 6 is press-bonded to the substrate 3, the volume V of the ACF 4 pressed by the liquid crystal driving IC 6 is expressed by Formula (1):

$$V = X \cdot Y \cdot t \quad (1)$$

(B) With the press-bonding operation completed as shown in FIG. 8, the volume $v_1$ of the ACF 4 removed by means of the bumps 16 is expressed by Formula (2):

$$v_1 = x \cdot y \cdot h \cdot n \quad (2)$$

In addition, with the press-bonding operation completed as shown in FIG. 8, the volume $v_2$ of the ACF 4 removed by means of the lands 13 is expressed by Formula (3):

$$v_2 = x \cdot y \cdot H \cdot n \quad (3)$$

For the sake of simplicity, the lands 13 and the bumps 16 are assumed to be of the same size.

(C) It is assumed that no ACF 4 protrudes beyond the external shape of the IC chip 6 during press-bonding. The total volume $v_0$ of the ACF 4 remained in excess during the press-bonding (that is, removed), is expressed by Formula (4):

$$v_0 = X \cdot Y \cdot (t-h) + v_1 + v_2 \quad (4)$$

where (t–h) indicates the amount by which the thickness of the ACF 4 is reduced by press-bonding.

(D) When it is assumed that the total volume $v_0$ of excess ACF 4 fills all of the through holes 9 in the substrate 3, and the total area of the through holes 9 is $S_0$, then $$S_0 \cdot T = v_0$$

Therefore, $$S_0 = \{X \cdot Y \cdot (t-h) + v_1 + v_2\}/T \quad (5)$$

(E) When R represents the ratio, in percent, of the total area $S_0$ of the through holes 9 in the substrate 3 to the liquid crystal driving IC 6, then $$R = (S_0/X \cdot Y) \times 100 \quad (6)$$

Here, the through holes 9 may be either round holes or square holes or a combination of these, or holes with any other shape.

(F) For example, when the through holes 9 are round holes, and the volume $v_0$ of excess ACF 4 fills all of the round holes, then $$v_0 = (d/2)^2 \cdot \pi \cdot T \cdot N \quad (7)$$

Therefore, $$N = v_0/(d/2)^2 \cdot \pi \cdot T = \{X \cdot Y \cdot (t-h) + v_1 + v_2\}/(d/2)^2 \cdot \pi \cdot T \quad (8)$$

(G) The simulation results are given in the following table.

TABLE 1

| R (%) | 8.9 | 17.9 | 7.9 | 7.0 | 4.4 | 2.2 | 1.1 | 0.1 |
|---|---|---|---|---|---|---|---|---|
| X ($\mu$m) | 3000 | 3000 | 3000 | 3000 | 3000 | 3000 | 3000 | 3000 |
| Y ($\mu$m) | 10000 | 10000 | 10000 | 10000 | 10000 | 10000 | 10000 | 10000 |
| x ($\mu$m) | 70 | 70 | 70 | 70 | 70 | 70 | 70 | 70 |
| y ($\mu$m) | 70 | 70 | 70 | 70 | 70 | 70 | 70 | 70 |
| h ($\mu$m) | 16 | 18 | 18 | 20 | 18 | 16 | 18 | 18 |
| n | 300 | 300 | 300 | 300 | 300 | 300 | 300 | 300 |
| t ($\mu$m) | 35 | 35 | 25 | 35 | 35 | 35 | 35 | 27 |
| T ($\mu$m) | 100 | 100 | 100 | 100 | 200 | 400 | 800 | 800 |
| H ($\mu$m) | 9 | 0 | 0 | 9 | 9 | 9 | 9 | 9 |
| d ($\mu$m) | 300 | 300 | 300 | 300 | 300 | 300 | 300 | 300 |
| N | 37.7 | 75.9 | 33.5 | 29.6 | 18.8 | 9.4 | 4.7 | 20.5 |

| R (%) | 7.5 | 3.8 | 11.5 | 7.8 |
|---|---|---|---|---|
| X ($\mu$m) | 3000 | 3000 | 3000 | 3000 |
| Y ($\mu$m) | 10000 | 10000 | 10000 | 10000 |
| x ($\mu$m) | 70 | 70 | 70 | 70 |
| y ($\mu$m) | 70 | 70 | 70 | 70 |
| h ($\mu$m) | 18 | 18 | 18 | 18 |
| n | 300 | 300 | 300 | 300 |
| t ($\mu$m) | 28 | 28 | 20 | 30 |
| T ($\mu$m) | 25 | 50 | 25 | 50 |

TABLE 1-continued

| H (μm) | 9 | 9 | 0 | 9 |
| d (μm) | 300 | 300 | 300 | 300 |
| N | 31.9 | 16.0 | 48.9 | 33.0 |

In Table 1, R is determined using Formula (6), and N is determined using Formula (8). In Table 1, the data of T=100 μm or more are those obtained for COB type mounting structures, whereas the data of T=50 μm or less are those obtained for COF type mounting structures.

(H) The ratio of the through holes 9 provided in the substrate 3, in percent, varies, for example, with the combination of the size of the liquid crystal driving IC 6, the size and number of bumps 16, the thickness of the ACF 4, the thickness of the substrate 3, and the thickness of the lands 13. To ensure joining reliability of the ACF 4, a sufficient amount of ACF 4 must be placed between the liquid crystal driving IC 6 and the substrate 3, in which case an ACF 4 with the proper thickness can be selected.

However, in the real press-bonding process, it is necessary to press-bond combinations of various component parts, and it is difficult to properly use the different types of ACF 4 in such a way that the best ACF 4 type is used for a specific combination of component parts. In contrast to this, according to the present invention, when the ACF 4 is thick, the excess ACF 4 can escape to the transfixion holes 9 to ensure an optimum press-bonding state, thereby allowing various types of component parts to be press-bonded together, even when the thickness of the ACF 4 varies within a small range.

Referring to the simulation results given above, it is desirable that the ratio R, in percent, of the area of the transfixion holes 9 to the area of the liquid crystal driving IC 6 (that is, the semiconductor chip) be $0\% < R \leq 18\%$ By setting R within this range, the excess adhesive can reliably escape to the transfixion holes during press-bonding.

It is more desirable that the ratio R, in percent, of the area of the transfixion holes 9 to the area of the semiconductor chip be $2\% \leq R \leq 10\%$ By setting R within this range, the excess adhesive can reliably escape to the transfixion holes during press-bonding, so that the substrate can provide a larger area for forming wiring patterns thereon.

Regarding the above-described mounting structure of a semiconductor chip, it is desirable to form the through holes, to be formed in the substrate, within an area surrounded by the lands such that they are provided closer to the lands than to the center portion of the area. This allows all of the excess adhesive, removed by the bumps and the lands, to reliably escape to the transfixion holes.

More specifically, it is desirable that the transfixion holes 9 be formed within a range D2 that is equal to or less than two-thirds of the distance D1 between the center C of the IC chip 6 and the bumps 16, as shown in FIG. 8. For example, when the width of the IC chip 6 is X=3 mm (=3000 μm), and the distance D3 from an end surface of the IC chip 6 to an inside end surface of the bumps 16 is 0.3 mm, then $D1 = X/2 - D3 = 3/2 - 0.3 = 1.2$ mm Therefore, $D2 = D1 \times 2/3 = 0.8$ mm This means that it is desirable that the transfixion holes 9 be formed within a range of 0.8 mm from the inside end surface of the bumps 16.

(Other Modifications)

The present invention is described with preferable embodiments, the present invention is not limited to the above-preferred embodiments, so that various modifications can be made within the scope of the claims of the present invention.

For example, although a liquid crystal driving IC was mounted to the semiconductor chip of the present invention, various other types of ICs used for various purposes may also be used. In addition, although the substrate, onto which the semiconductor chip is mounted, is not limited to the wirings on both sides, other types of circuit boards, such as a single layer substrate or a multi-layered substrate may also be used.

Further, although the bumps 16 and the transfixion holes 10 of FIG. 1 were linearly arranged in rows, the arrangement of wires is not particularly limited. For example, the wires may be disposed in a zigzag arrangement.

According to the mounting structure of a semiconductor chip, the liquid crystal device, and the electronic equipment, in accordance with the present invention, transfixion holes are formed in the substrate, so that when the semiconductor chip is being press-bonded to the substrate with too much adhesive therebetween, the excess adhesive can escape to the transfixion holes, thereby making it possible to prevent generation of a large residual stress in the adhesive during press-bonding and as a result of which, joining failure does not occur with the passage of time.

In addition, according to the present invention, the plurality of transfixion holes are provided within the area surrounded by a plurality of lands such that they are spread out over the area and not concentrated in one location of the substrate, thereby allowing excess adhesive to escape evenly, and thus preventing the generation of residual stress in the adhesive over almost throughout the entire semiconductor chip.

What is claimed is:

1. A mounting structure of a semiconductor chip comprising:
    a semiconductor chip with a plurality of bumps;
    a substrate with a plurality of lands, in which said semiconductor chip and said substrate are connected together with an adhesive so as to allow electrical conduction between said bumps and said lands; and
    a plurality of transfixion holes formed in an area of said substrate surrounded by said lands such that said transfixion holes are spread out over the area, wherein a ratio R, in percent, of the total area of said transfixion holes to the area of said semi conductor chip is:

$$0\% < R \leq 18\%.$$

2. The mounting structure of a semiconductor chip according to claim 1,
wherein the ratio R, in percent, of the total area of said transfixion holes to the area of said semiconductor chip is:

$$2\% \leq R \leq 10\%.$$

3. The mounting structure of a semiconductor chip according to claim 1, wherein said transfixion holes are provided closer to said lands than to a center portion of the area that is surrounded by said plurality of lands.

4. The mounting structure of a semiconductor chip according to claim 1,
wherein said substrate has therein a plurality of through holes for allowing electrical conduction between wiring layers on the front and the back sides of said substrate, said plurality of transfixion holes being formed by said through holes.

5. A liquid crystal device comprising liquid crystal sandwiched between a pair of light-transmissive substrates, in which the orientation of said liquid crystal is controlled as a result of controlling the voltage applied to said liquid crystal in order to modulate the light incident upon said liquid crystal;
wherein said liquid crystal device further includes a mounting structure of a semiconductor chip, said structure being affixed to at least one of said light-transmissive substrates, said structure having a liquid crystal driving IC with a plurality of bumps, and a substrate with a plurality of lands, said liquid crystal driving IC and said substrate being connected together with an adhesive so as to allow electrical conduction between said bumps and said lands, said substrate having therein a plurality of transfixion holes in an area of said substrate surrounded by said lands such that said transfixion holes are spread out over the area.

6. The liquid crystal device according to claim 5,
wherein the ratio R, in percent, of the total area of said transfixion holes to the area of said liquid crystal driving IC is:

$$0\% < R \leq 18\%.$$

7. The liquid crystal device according to claim 5,
wherein the ratio R, in percent, of the total area of said transfixion holes to the area of said liquid crystal driving IC is:

$$2\% \leq R \leq 10\%.$$

8. The liquid crystal device according to claim 5,
wherein said transfixion holes are provided closer to said lands than to the center portion of the area that is surrounded by said plurality of lands.

9. The liquid crystal device according to claim 5,
wherein said substrate has therein a plurality of through holes for allowing electrical conduction between wiring layers on the front and the back sides of said substrate, said plurality of transfixion holes being formed by said through holes.

10. Electronic equipment comprising said liquid crystal device of claim 5.

11. A circuit structure comprising:
a substrate;
an adhesive coupled to said substrate; and
a circuit driver coupled to said adhesive;
wherein said substrate includes a mounting area having a plurality of holes formed therein for accomodating said adhesive as said circuit driver is pressed against said substrate.

12. The circuit structure of claim 11 further comprising a plurality of wires disposed on said substrate, each of said wires including a land formed at an end thereof along an interior edge of said mounting area.

13. The circuit structure of claim 12 wherein said holes are located within a region of said mounting area bordered by said lands.

14. The circuit structure of claim 12 wherein said holes are located proximate said lands.

15. The circuit structure of claim 11 wherein said holes comprise 0 to 18 percent of a total area of said mounting area.

16. The circuit structure of claim 11 wherein said holes comprise 2 to 10 percent of a total area of said mounting area.

17. A mounting structure of a semiconductor chip comprising:
a semiconductor chip with a plurality of bumps;
a substrate with a plurality of lands, in which said semiconductor chip and said substrate are connected together with an adhesive so as to allow electrical conduction between said bumps and said lands; and
a plurality of transfixion holes formed in an area of said substrate surrounded by said lands such that said transfixion holes are spread out over the area,
wherein a ratio R, in percent, of the total area of said transfixion holes to the area of said semiconductor chip is:

$$2\% \leq R \leq 10\%.$$

18. The mounting structure of a semiconductor chip according to claim 17, wherein said transfixion holes are provided closer to said lands than to a center portion of the area that is surrounded by said plurality of lands.

19. The mounting structure of a semiconductor chip according to claim 17, wherein said substrate has therein a plurality of through holes for allowing electrical conduction between wiring layers on the front and the back sides of said substrate, said plurality of transfixion holes being formed by said through holes.

20. A mounting structure of a semiconductor chip comprising:
a semiconductor chip with a plurality of bumps; and
a substrate with a plurality of lands, in which said semiconductor chip and said substrate are connected together with an adhesive so as to allow electrical conduction between said bumps and said lands,
wherein a plurality of transfixion holes are formed within an area of said substrate surrounded by said lands such that said transfixion holes are spread out over the area for reducing residual stress.

21. The mounting structure of a semiconductor chip according to claim 20, wherein a ratio R, in percent, of the total area of said transfixion holes to the area of said semiconductor chip is:

$$0\% < R \leq 18\%.$$

22. The mounting structure of a semiconductor chip according to claim 20, wherein a ratio R, in percent, of the total area of said transfixion holes to the area of said semiconductor chip is:

$$2\% \leq R \leq 10\%.$$

23. The mounting structure of a semiconductor chip according to claim 20, wherein said transfixion holes are provided closer to said lands than to a center portion of the area that is surrounded by said plurality of lands.

24. The mounting structure of a semiconductor chip according to claim 20, wherein said substrate has therein a plurality of through holes for allowing electrical conduction between wiring layers on the front and the back sides of said substrate, said plurality of transfixion holes being formed by said through holes.

* * * * *

UNITED STATES PATENT AND TRADEMARK OFFICE
CERTIFICATE OF CORRECTION

PATENT NO. : 6,265,770 B1
DATED : July 24, 2001
INVENTOR(S) : Kenji Uchiyama

Page 1 of 1

It is certified that error appears in the above-identified patent and that said Letters Patent is hereby corrected as shown below:

Column 1,
Line 49, "57 a" should be -- 57a --

Column 7,
Line 22, "nay" should be -- may --

Column 8,
Line 1, delete "the"
Line 39, delete ";"

Column 9,
Line 19, "GUCF" should be -- ACF --

Column 10,
Line 50, both "16" should be -- 18 --
Line 56, "20.5" should be -- 0.5 --

Signed and Sealed this

Twenty-sixth Day of March, 2002

*Attest:*

*Attesting Officer*

JAMES E. ROGAN
*Director of the United States Patent and Trademark Office*